United States Patent [19]

Dyer

[11] Patent Number: 4,864,526
[45] Date of Patent: Sep. 5, 1989

[54] INTERPOLATOR/DECIMATOR FILTER STRUCTURE AND A DIGITAL FILTER THEREFOR

[75] Inventor: Nigel P. Dyer, London, England

[73] Assignee: Plessey Overseas Limited, Ilford, England

[21] Appl. No.: 894,996

[22] Filed: Aug. 8, 1986

[30] Foreign Application Priority Data

Aug. 28, 1985 [GB] United Kingdom ............... 8521376

[51] Int. Cl.$^4$ ............................................. G06F 15/31
[52] U.S. Cl. ........................... 364/724.10; 364/724.17
[58] Field of Search .............. 364/724, 724.01, 724.07, 364/724.1, 724.15, 724.16, 724.17

[56] References Cited

U.S. PATENT DOCUMENTS

| | | | |
|---|---|---|---|
| 3,855,423 | 12/1974 | Brendzel et al. | 364/724 |
| 4,270,026 | 5/1981 | Shenoi et al. | 381/31 |
| 4,270,027 | 5/1981 | Agrawal et al. | 381/31 |
| 4,302,631 | 11/1981 | Shenoi et al. | 364/724 |
| 4,649,507 | 3/1987 | Inaba et al. | 364/724 |

OTHER PUBLICATIONS

Nussbaumer, "Digital Filtering Using a Split Vesting Technique" *IBM Tech. Disclosure Bulletin*, vol. 21, #12, pp. 647-648, Jul. 1978.

Nussbaumer, "Nesting Implementation of Digital Filter Banks", *IBM Tech. Disclosure Bulletin*, vol. 24 #6, pp. 3068-3073, Nov. 1981.

Glöckler, "A Unified State-Space Representation of Digital Multirate Filters", *Signal Proc. II: Theories and Applications*, pp. 61-67, Elsevier Science Publishers, B. V. (North-Holland), 1983.

Primary Examiner—Gary V. Harkom
Assistant Examiner—Dale M. Shaw
Attorney, Agent, or Firm—Fleit, Jacobson, Cohn, Price, Holman & Stern

[57] ABSTRACT

An interpolator or decimator filter structure operable between two sampling rates ($F_s$ and $2F_s$), and in which two branches (21 and 23) of the structure are divided into low and high frequency sections by sampling switches (27 and 29). The high frequency section of one branch (21) incorporates a composite filter comprises of a nesting filter (1') and a nested filter 1. Each of these filters 1, 1' includes a digital coefficient multiplier (5,5'). The coefficient ($K_2$) of the coefficient multiplier (5), part of the nested filter (1), is preset to a value such that 3 dB attenuation occurs at a point offset in frequency from one-half the lower sampling rate ($F_s$).

3 Claims, 3 Drawing Sheets

INTERPOLATOR/DECIMATOR FILTER STRUCTURE AND A DIGITAL FILTER THEREFOR

TECHNICAL FIELD

The present invention concerns improvements in or relating to interpolator and decimator filter structures of the type incorporating recursive digital filters. The invention also concerns improved design of the same digital filters.

BACKGROUND ART

Novel forms of interpolator/decimator filter structure have been described recently in the literature. In particular, reference is made to the two articles: "Digital Signal Processing Schemes for efficient Interpolation and Decimation" by R. A. Valanzuala and A. G. Constantinides, reported in IEE. Proc. Vol. 130 No. 6 pp. 225-234 (December 1983); and, "Efficient Sampling Rate alteration using Recursive (IIR) Digital Filters" by R. Ansari and B. Lui, reported in IEEE Trans Acoust., Speech Sig Proc. Vol. ASSP-31 No. 6 pp. 1366-1373 (December 1983).

The structures described are capable of interpolating or decimating between two sampling rates related by a factor N where N is an integer. It proves most advantageous when N is 2, and it is this case that is considered further. It should be noted that Interpolation and Decimation between sampling rates differing by a factor of a power of two is easily implemented by a cascade of similar filters, each changing the frequency by a factor of two.

Important properties of these interpolator and decimator filter structures are as follows:

(i) The repeated use of simple All Pass Networks (APNs) to build up the filter structure, facilitating implementation, (ii) Most of the signal processing is performed at the lower of the two sampling frequencies, reducing the number of multiplications and additions required per unit time to achieve a given performance requirement compared to alternative filter structures, (iii) Good noise performance, (iv) Low sensitivity of filter performance to coefficient value, resulting in short wordlength co-efficients, (v) Reduced number of co-efficients required to implement a filter with given performance compared to alternative conventional filter structures.

However, there are some limitations to the performance of the filter structures as currently described in the literature. One of these limitations is that the frequency at which the attenuation of out of band signals increases to 3 dB is fixed at half of the lowest sampling frequency. This means that a filter to decimate from a 16 kHz to an 8 kHz sampling rate can only provide 3 dB attenuation of signals at 4 kHz. There are many applications which require the 3 dB point of the filter to be at some other frequency, so this is a severe limitation.

DISCLOSURE OF THE INVENTION

The present invention is intended as a solution to the problem aforesaid. Interpolator and Decimator filter structures are provided wherein the 3 dB attenuation point is offset from a frequency of one-half of the lower sampling rate, allowing better attenuation of out-of-band signal.

In accordance with the invention there is provided an interpolator-or-decimator filter structure operable between a lower and higher sampling rate comprising a pair of signal processing branches each of which is divided into a low-frequency section and a high frequency section by a corresponding sampling switch, wherein the high-frequency section of one branch includes a nested all-pass-network recursive digital filter, this digital filter being comprised essentially of a first recursive filter, including a first coefficient multiplier; and, a second recursive filter, including a second coefficient multiplier, this second filter being nested within the first recursive filter, the coefficient of the second coefficient multiplier being of a predetermined value such that 3 dB attenuation shall occur at a frequency offset from one-half of the lower sampling rate.

The solution thus adopted herein is the introduction of a nested all pass network filter operating at a high frequency in one of the two branches of the filter structure. Pre-selection of the second multiplier coefficient allows the 3 dB point to be offset from half the lower frequency sampling rate. This coefficient, if negative, corresponds to an offset to a lower frequency. This coefficient, if positive, corresponds to an offset to a higher frequency.

Further, in accordance with the invention there is also provided a recursive digital filter, for use in an interpolator or decimator filter structure, wherein the digital filter is characterised by a transform function of the form given by the expression:

$$B(Z) = \frac{A(Z) Z^{-1} + K_1}{1 + K_1 \cdot A(Z) \cdot Z^{-1}},$$

in which expression the term $A(Z)$ is a transform function of the form given by the expression:

$$A(Z) = \frac{Z^{-1} + K_2}{1 + K_2 \cdot Z^{-1}}$$

and in which the terms $K_1$ and $K_2$ are first and second non-zero multiplier coefficients, and the term $Z^{-1}$ is the unit delay transform operator, the filter being of nested structure comprised of a first filter including a first coefficient multiplier for multiplication by the first coefficient $K_1$; and, nested within this first filter, a second filter including a second coefficient multiplier for multiplication by the second coefficient $K_2$.

BRIEF INTRODUCTION OF THE DRAWINGS

In the drawings accompanying this specification:

DESCRIPTION OF PREFERRED EMBODIMENTS

Embodiments of the invention will now be described, by way of example only, and with particular reference to the drawings aforesaid.

Figure 1:
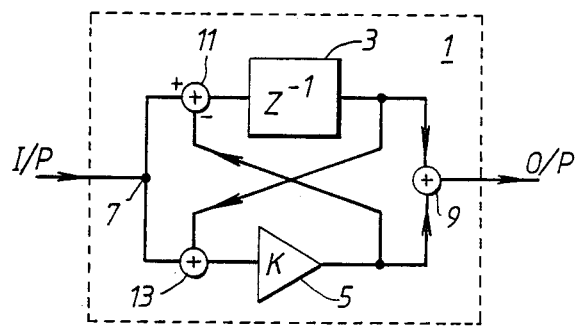
FIG. 1 is a circuit diagram for a known recursive digital filter.

In FIG. 1 can be seen a recursive digital filter of conventional structure. This filter 1 comprises a unit delay element 3 and in parallel therewith, a digital coefficient multiplier 5. The inputs of these are connected to a common input terminal 7, and the outputs are fed to a summing node 9 at filter output O/P. Cross-couplings are provided, one from the delay element output to the multiplier input and one from the multiplier output to the delay element input by means of subtractive and summing nodes, nodes 11 and 13 respectively, to provide feedback and feed forward for recursive operation.

The transform function A(Z) for this known filter has the form:

$$A(Z) = \frac{Z^{-1} + K}{1 + KZ^{-1}}$$

where K is the multiplier coefficient and $Z^{-1}$ is the unit delay operator.

Figure 2:
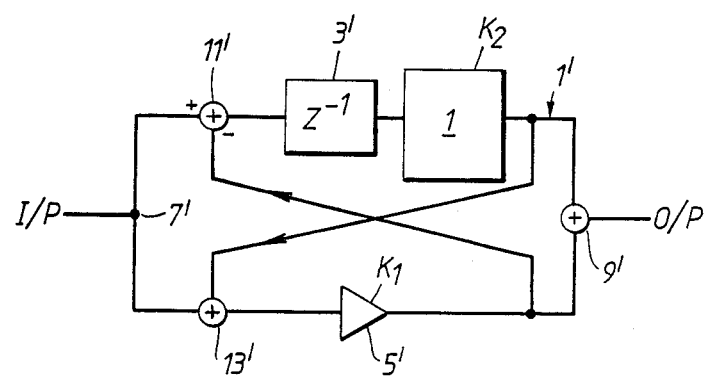
FIG. 2 is a circuit diagram for a recursive digital filter modified in accordance with this invention.

The modified recursive digital filter shown in FIG. 2 is a composite of two filters, one filter 1 being nested within the other filter 1'. This composite digital filter comprises thus a nested filter 1, constructed as shown in FIG. 1, and, a nesting filter 1' of otherwise exactly similar structure, having a second delay element 3', a coefficient multiplier 5', a common input terminal 7', a summing node 9' at output, a feedback subtractive node 11', a feed forward summing node 13' and cross-couplings. The nested filter 1, as shown, is located between the output of the delay element 3' and the feed forward coupling to the summing node 13'.

The transform function B(Z) for this composite filter has the form:

$$B(Z) = \frac{A(Z) \cdot Z^{-1} + K_1}{1 + K_1 \cdot A(Z) \cdot Z^{-1}},$$

where $A(Z) = \frac{Z^{-1} + K_2}{1 + K_2 \cdot Z^{-1}},$ and where $K_1$, $K_2$ are the multiplier coefficients of the nesting filter 1' and the nested filter 1, respectively.

Figure 5:
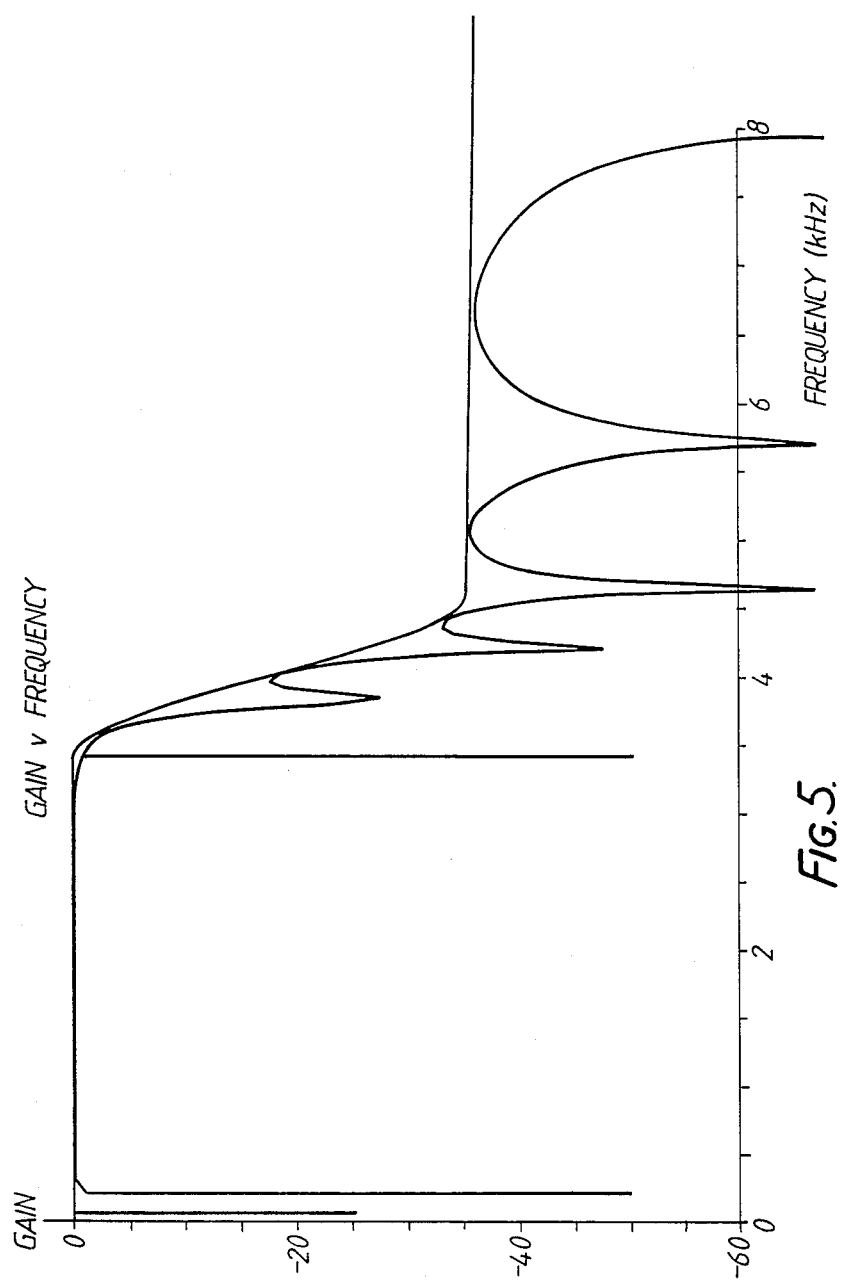

FIG. 5 shows a typical attenuation requirement for a decimator or interpolator for change between a 16 kHz sampling rate and an 18 kHz sampling rate. The requirement shown is for the 3 dB point to be at approximately 3.5 kHz. The approach is this design problem is to design a 'Prior Art' filter using APNs to meet the performance requirement assuming that the 3 dB point is at 4 kHz, ie. to keep the inner co-efficient $K_2$ of the nested all pass network at zero, and then to further optimise the filter, varying the iner co-efficient $K_2$ until the 3 dB point is at the position required to meet the performance requirement.

Figure 3:
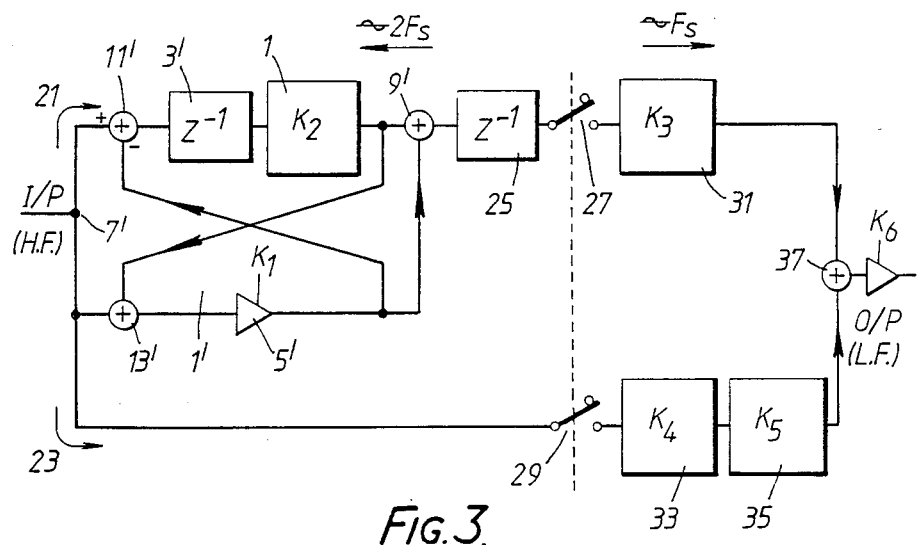
FIGS. 3 and 4 are circuit diagrams of a decimator filter structure and an interpolator filter structure respectively, each incorporating the filter of FIG. 2 above; and, FIG. 5 is a gain-versus frequency response graph for this filter.

FIG. 3 shows a decimator filter structure implemented using this approach. The input signal travels along two branch paths 21 and 23, each consisting of a cascade of all pass networks. Elements 3' to 13' comprise the nested all pass network 1' which operates at the higher of the two sampling frequencies $F_s$, $2F_s$. Element 1 is the 'inner' all pass network filter, whose coefficient $K_2$ is largely responsible for the position of the 3 dB point. Element 25 is a single delay element which delays the output signal by one clock cycle at the higher of the two sample rates, rate $2F_s$.

The next step is to subsample the signals travelling down the two branches 21, 23 of the filter by switches 27 and 29, and then pass the subsampled signals through further all pass networks 31, 33 and 35 which operate at the lower of the two sampling rates, rate $F_s$. The outputs are summed at a summing node 37 and the amplitude of the final signal reduced by a factor 0.5.

Typical coefficient values for one design of decimator filter structure are given in Table 1 appearing below:

TABLE 1

| Coefficient | Decimal Value |
|---|---|
| $K_1$ | 0.84375 |
| $K_2$ | −0.109375 |
| $K_3$ | 0.640625 |
| $K_4$ | 0.80078125 |
| $K_5$ | 0.2265625 |
| $K_6$ | 0.5 |

To meet a given requirement for out-of-band signal attenuation, a number of changes can be made. The number of all pass networks in each branch of the filter structure can be changed, and the values of all the multiplier co-efficients can be changed, enabling design of the filter structure to meet a wide variety of frequency response requirements.

Figure 4:
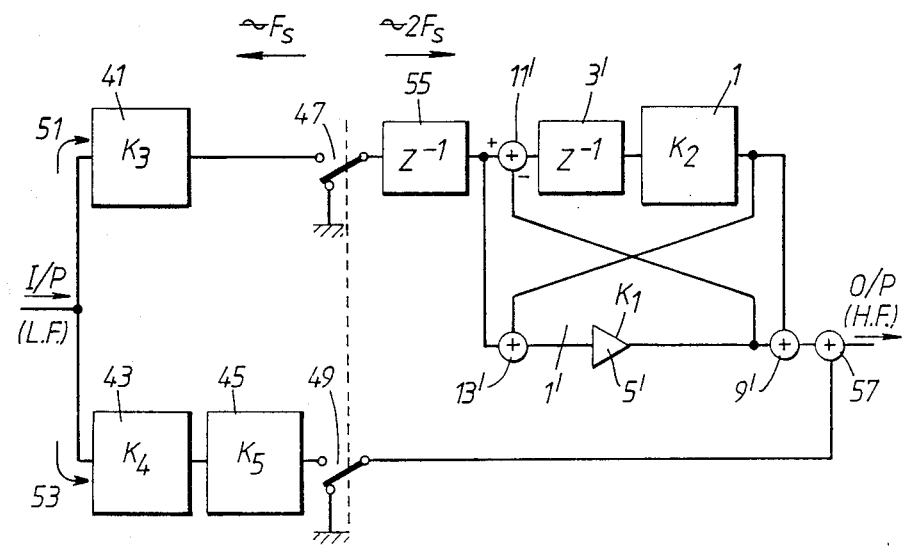

FIG. 4 shows an Interpolator filter structure likewise implemented using the above approach. Here APN filters 41, 43 and 45 operate on the input signal at the lower of the two sampling rates. Switches 47 and 49 increase the sample rate by a factor of two by introducing additional samples. All the additional samples are set to zero. The signal on one 51 of the two branches 51, 53 of the filter structure is now passed through a delay element 55 and then a nested all pass network filter 1' which operates in an identical manner to the nested all pass network 1' described above. The outputs from the two branches of the filter structure are then summed together at a summing node 57 to give the final filtered, interpolated output.

Typical coefficient values for one design of interpolator filter structure are given in Table 2 appearing below:

TABLE 2

| Coefficient | Decimal Value |
|---|---|
| $K_1$ | 0.84375 |
| $K_2$ | −0.109375 |
| $K_3$ | 0.640625 |
| $K_4$ | 0.80078125 |
| $K_5$ | 0.2265625 |

Other configurations of recursive filter characterised by the transform function A(Z) given above will be evident to those of skill in the art and it is not intended that the configuration of composite filter be restricted to that specifically described above.

I claim:

1. A filter structure for interpolating or decimating between two sampling rates, said structure comprising first and second signal processing branches, each of said signal processing branches comprises a low frequency section and a high frequency section, a respective sampling switch in each of said branches, said sampling switches serving to divide said branches between said low frequency and said high frequency sections, a nested all-pass-network recursive digital filter included in said high frequency section of said first branch, said recursive digital filter comprising a first recursive filter including a first coefficient multiplier and a second recursive filter including a second coefficient multiplier, said second recursive filter being nested within said first recursive filter and said second coefficient multiplier having a predetermined coefficient value.

2. A recursive digital filter, for use in an interpolator or decimator filter structure, wherein the digital filter is characterised by a transform function of the form given by the expression:

$$B(Z) = \frac{A(Z) Z^{-1} + K_1}{1 + K_1 \cdot A(Z) \cdot Zy - y1,}$$

in which expression the term A(Z) is a transform function of the form given by the expression:

$$A(Z) = \frac{Z^{-1} + K_2}{1 + K_2 \cdot Z^{-1}}$$

and in which the terms $K_1$ and $K_2$ are first and second non-zero multiplier coefficients, and the term $Z^{-1}$ is the unit delay transform operator, the filter being of nested structure comprised of a first filter including a first coefficient multiplier for multiplication by the first coefficient $K_1$; and, nested within this first filter, a second filter including a second coefficient multiplier for multiplication by the second coefficient $K_2$.

3. A recursive digital filter, as claimed in claim 2, wherein the first filter, the second filter, or both, comprise:

a common input terminal;

a unit delay element connected to the terminal via a substrative node;

a coefficient multiplier connected to the terminal via a first summing node;

a second summing node connected in parallel to the outputs of the delay element and the multiplier; and, cross-couplings from these outputs to the subtractive node and first summing node, respectively.

* * * * *